United States Patent
Komatsu et al.

(10) Patent No.: US 12,051,983 B2
(45) Date of Patent: Jul. 30, 2024

(54) POWER CONVERSION SYSTEM HAVING A PLURALITY OF POWER CONVERSION DEVICES CONNECTED IN PARALLEL

(71) Applicant: TMEIC Corporation, Chuo-ku (JP)

(72) Inventors: Hiroyoshi Komatsu, Tokyo (JP); Masahiro Kinoshita, Tokyo (JP)

(73) Assignee: TMEIC Corporation, Chuo-ku (JP)

( * ) Notice: Subject to any disclaimer, the term of this patent is extended or adjusted under 35 U.S.C. 154(b) by 261 days.

(21) Appl. No.: 17/416,599

(22) PCT Filed: Aug. 6, 2019

(86) PCT No.: PCT/JP2019/030996
§ 371 (c)(1),
(2) Date: Jun. 21, 2021

(87) PCT Pub. No.: WO2021/024394
PCT Pub. Date: Feb. 11, 2021

(65) Prior Publication Data
US 2022/0069734 A1    Mar. 3, 2022

(51) Int. Cl.
*H02M 7/48* (2007.01)
*H02J 3/38* (2006.01)
(Continued)

(52) U.S. Cl.
CPC ............. *H02M 7/493* (2013.01); *H02J 3/381* (2013.01); *H02M 1/0003* (2021.05);
(Continued)

(58) Field of Classification Search
CPC .......... H02M 5/40; H02M 5/42; H02M 5/453; H02M 7/7575; H02M 5/458; H02M 5/45;
(Continued)

(56) References Cited

U.S. PATENT DOCUMENTS 5,227,962 A * 7/1993 Marsh ................... H02J 3/1864
363/39
5,805,032 A * 9/1998 Herbst ................. H03H 1/0007
363/47
(Continued)

FOREIGN PATENT DOCUMENTS

CN       202633962    * 12/2012
CN       103414327 A   11/2013
(Continued)

OTHER PUBLICATIONS

English Translation for CN 202633962 is provided.*
(Continued)

*Primary Examiner* — Thienvu V Tran
*Assistant Examiner* — Nusrat Quddus
(74) *Attorney, Agent, or Firm* — Oblon, McClelland, Maier & Neustadt, L.L.P.

(57) ABSTRACT

A power conversion system including a plurality of power conversion devices connected in parallel. Each of the plurality of power conversion devices includes: a power conversion circuit configured to convert DC to AC; and an AC filter circuit connected to an output side of the power conversion circuit. The AC filter circuit is an LC low-pass filter including a first filter reactor and an AC filter capacitor connected in an L shape. The AC filter circuit further includes a second filter reactor connected in series to the AC filter capacitor, and a resistance constructing a series circuit together with the AC filter capacitor and the second filter reactor.

3 Claims, 6 Drawing Sheets

(51) Int. Cl.
*H02M 1/00* (2006.01)
*H02M 1/12* (2006.01)
*H02M 7/493* (2007.01)
*H03H 7/09* (2006.01)

(52) U.S. Cl.
CPC ......... *H02M 1/126* (2013.01); *H02M 7/4803* (2021.05); *H03H 7/09* (2013.01); *H02J 2300/28* (2020.01)

(58) Field of Classification Search
CPC .. H02M 5/4585; H02M 5/4505; H02M 5/451; H02M 5/452; H02M 5/447; H02M 5/456; H02M 1/12; H02M 1/4266; H02M 2001/123; H02M 3/073; H02M 3/10; H02M 3/135; H02M 3/137; H02M 3/28; H02M 3/315; H02M 3/3155; H02M 3/325; H02M 3/335; H02M 7/10; H02M 7/515; H02M 7/521; H02M 7/53; H02M 7/537; H02M 7/5383; H02M 7/538466; H02M 7/53862; H02M 7/5387; H02M 7/53871; H02M 7/53875; H02M 7/757; H02M 7/79; H02M 3/337; H02M 3/338; H02M 3/3382; H02M 3/3384; H02M 7/538; H02M 7/53806; H02M 7/53832; H02M 7/53835; H02M 7/487; H02M 7/539; H02M 7/23; H02M 7/217; H02M 7/21; H02M 7/12; H02M 7/04; H02M 7/00; H02H 7/261; H02H 7/268; H02J 3/36; H02J 3/01
See application file for complete search history.

(56) References Cited

U.S. PATENT DOCUMENTS

| | | | | |
|---|---|---|---|---|
| 6,075,425 A * | 6/2000 | Gopfrich | ............... | H02H 9/005 363/47 |
| 6,208,537 B1 * | 3/2001 | Skibinski | ............... | H02M 1/12 363/40 |
| 9,065,323 B2 * | 6/2015 | Phadke | ............... | H02J 3/381 |
| 2003/0053320 A1 * | 3/2003 | Zhou | ............... | H02M 1/126 363/39 |
| 2006/0033479 A1 * | 2/2006 | Chou | ............... | H02J 3/01 323/207 |
| 2013/0088080 A1 * | 4/2013 | Smith | ............... | H02M 1/126 307/43 |
| 2018/0366943 A1 * | 12/2018 | Matsuoka | ............... | H02M 1/32 |
| 2019/0123662 A1 * | 4/2019 | Zhang | ............... | H02J 3/381 |
| 2020/0343872 A1 * | 10/2020 | Nowosad | ............... | H02J 3/01 |
| 2021/0203249 A1 * | 7/2021 | Yamabe | ............... | H02P 27/06 |
| 2022/0103086 A1 * | 3/2022 | Liu | ............... | H02M 1/32 |
| 2022/0212808 A1 * | 7/2022 | Solodovnik | ............... | H02M 5/458 |
| 2022/0224301 A1 * | 7/2022 | Li | ............... | H03H 7/06 |

FOREIGN PATENT DOCUMENTS

| | | | | |
|---|---|---|---|---|
| CN | 108306332 A | | 7/2018 | |
| DE | 19547969 C1 * | | 6/1997 | ............... H02J 3/01 |
| JP | 2009-177978 A | | 8/2009 | |
| JP | 2014-54120 A | | 3/2014 | |
| JP | 2014-183601 A | | 9/2014 | |

OTHER PUBLICATIONS

English Translation for DE-19547969-C1 is provided.*
International Search Report issued Oct. 29, 2019 in PCT/JP2019/030996 filed Aug. 6, 2019, 2 pages.
Extended European Search Report issued Mar. 14, 2023 in European Patent Application No. 19940175.3, 8 pages.
Indian Office Action issued Mar. 11, 2022 in Indian Patent Application No. 202117027729, 5 pages.
Combined Chinese Office Action and Search Report issued May 26, 2023 in Chinese Patent Application No. 201980085380.4 (with unedited computer-generated English Translation), 14 pages.

* cited by examiner

POWER CONVERSION SYSTEM HAVING A PLURALITY OF POWER CONVERSION DEVICES CONNECTED IN PARALLEL

FIELD

The present application relates to a power conversion system.

BACKGROUND

As disclosed in JP 2014-183601 A, a power conversion system has been conventionally known where a plurality of power conversion devices are connected in parallel. Referring to FIG. 2, for example, of JP 2014-183601 A, each of the plurality of power conversion devices includes a power conversion circuit, and an AC filter circuit connected to the output side of the power conversion circuit. The AC filter circuit includes an AC filter reactor and an AC filter capacitor.

Known LC low-pass filters have various circuitry types including an L type, a T type, and a Π (pi) type. With respect to such a point, it is clearly described in paragraph 0017 of the above-mentioned JP 2014-183601 A that an AC filter for removing high frequency voltage components may be a T-type filter.

CITATION LIST

Patent Literature

[PTL 1] JP 2014-183601 A

SUMMARY

Technical Problem

The AC filter circuit is required to have both passing performance, which allows a fundamental wave current to pass therethrough, and damping performance, which filters high frequency components, such as a ripple current. There is a demand to ideally realize such performances with circuit components having as small a size as possible. However, a power conversion system in which a plurality of power conversion devices are connected in parallel has a further matter which should be taken into consideration. In the case where the plurality of power conversion devices are connected in parallel, an electric current may be generated between one power conversion device and another power conversion device due to resonance of AC filter circuit elements. Hereinafter, this electric current due to resonance is also referred to as "resonant current".

From the viewpoint of suppressing the above-mentioned resonant current, as in the case of a T-type LC low-pass filter, it is preferable to provide an AC filter reactor on the downstream side of an AC filter capacitor. This is because this AC filter reactor provided on the downstream side acts as a so-called damping element. However, the AC filter reactor provided on the downstream side of the AC filter capacitor is required to allow a fundamental wave current to flow therethrough, thus being required to be a component having a certain size. As a result, the T-type LC low-pass filter has a problem that a reduction in size of the AC filter circuit is difficult.

It is an object of the present application to provide a power conversion system which can achieve both a reduction in size of the AC filter circuit and suppression of a resonant current.

Solution to Problem

The present application is directed to a power conversion system including a plurality of power conversion devices connected in parallel,
each of the plurality of power conversion devices including:
a power conversion circuit configured to convert DC to AC; and
an AC filter circuit connected to an output side of the power conversion circuit,
the AC filter circuit being an LC low-pass filter including a first filter reactor and an AC filter capacitor connected in an L shape, and
the AC filter circuit further including a second filter reactor connected in series to the AC filter capacitor, and a resistance constructing a series circuit together with the AC filter capacitor and the second filter reactor.

Advantageous Effects of Invention

According to the power conversion system of the present application, the second filter reactor is connected in series to the AC filter capacitor of the L-type LC low-pass filter. A fundamental wave current does not flow into the second filter reactor so that even a reactor having a small size can satisfy required performance. Therefore, it is possible to achieve a reduction in size of constitutional components of the AC filter circuit while required performance of the AC filter circuit is satisfied. Further, the resistance provided to the AC filter circuit acts as a damping element. Accordingly, it is possible to achieve both a reduction in size of the AC filter circuit and suppression of a resonant current.

DESCRIPTION OF EMBODIMENT

Figure 1:
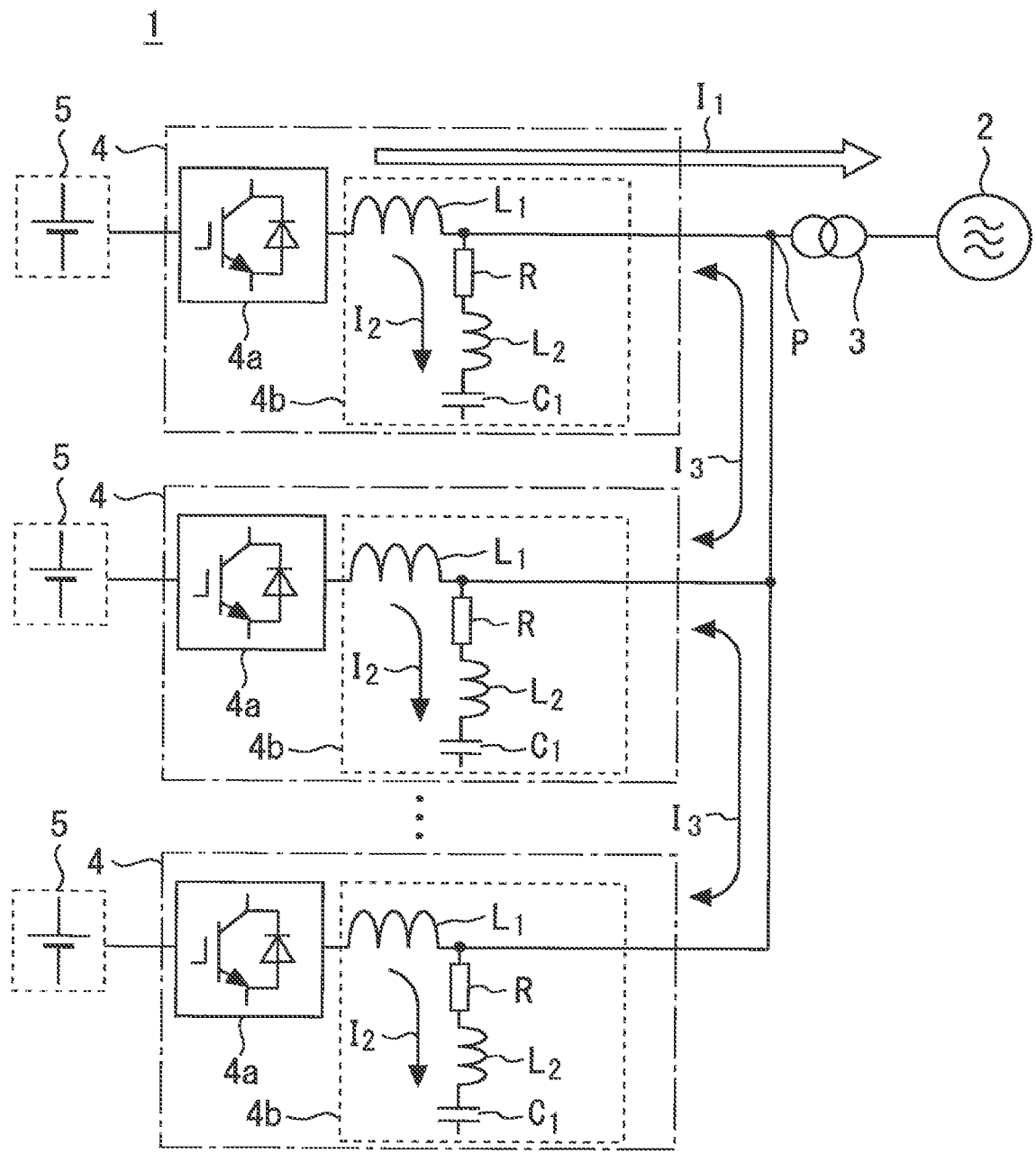
FIG. 1 is a system configuration diagram of a power conversion system according to an embodiment.

FIG. 1 is a system configuration diagram of a power conversion system 1 according to an embodiment. As shown in FIG. 1, the power conversion system 1 is a grid interconnection system including a plurality of power conversion devices 4 connected in parallel. The respective output sides of the plurality of power conversion devices 4 are joined via a parallel junction P. An upper transformer 3 is provided between the parallel junction P and a power system 2.

Each of the plurality of power conversion devices 4 includes a power conversion circuit 4a, which converts DC to AC, and an AC filter circuit 4b, which is connected to the output side of the power conversion circuit 4a. One example of the power conversion circuit 4a according to the embodiment is a voltage controlled three-phase inverter circuit.

The input side of each of the plurality of power conversion devices 4 is provided with a distributed power supply 5. The distributed power supply 5 is a DC power supply. The power conversion device 4 converts DC power from the distributed power supply 5 to AC power, and outputs the AC power toward the power system 2 side.

For the distributed power supply 5, any of the following various power supplies may be suitably used. For example, the distributed power supply 5 may be a power generation facility or a battery facility. For example, the battery facility may be a storage battery facility including a secondary battery capable of controlling charging and discharging (that is, a storage battery). For example, the battery facility may be a fuel cell facility which causes electric power to be generated from chemical energy of fuel by an electrochemical reaction. For example, the power generation facility may be a so-called renewable energy generation facility. The renewable energy generation facility may be a photovoltaic power generation facility. Alternatively, the renewable energy generation facility may be a wind power generation facility which includes a wind power generator and a converter device which converts the output from this wind power generator to DC power.

The plurality of distributed power supplies 5 included by the power conversion system 1 may be power supplies of the same kind. Alternatively, the plurality of distributed power supplies 5 may be power supplies of different kinds. In other words, some of the distributed power supply 5 may be power supplies of a first kind from the above-mentioned various power supplies, and the remaining distributed power supplies 5 may be power supplies of a second kind from the above-mentioned various power supplies.

Each AC filter circuit 4b includes a first filter reactor $L_1$, an AC filter capacitor $C_1$, a second filter reactor $L_2$, and a resistance R. The AC filter circuit 4b is an LC low-pass filter where the first filter reactor $L_1$ and the AC filter capacitor $C_1$ are connected in an L shape. The second filter reactor $L_2$ is connected in series to the AC filter capacitor $C_1$. The resistance R constructs a series circuit together with the AC filter capacitor $C_1$ and the second filter reactor $L_2$.

Specifically, one end of the first filter reactor $L_1$ is connected to the output side of the power conversion circuit 4a. The other end of the first filter reactor $L_1$ is connected to one end of the resistance R. One end of the second filter reactor $L_2$ is connected to the other end of the resistance R. The other end of the second filter reactor $L_2$ is connected to one end of the AC filter capacitor $C_1$. The resistance R, the second filter reactor $L_2$ and the AC filter capacitor $C_1$ are connected in series in that order so that an RLC series circuit is constituted.

In the embodiment, an interconnection reactor, an interconnection transformer or the like is not provided between the parallel junction P and the AC filter circuit 4b. This is because the resistance R functions as a damping resistance R in the embodiment so that components of the damping element, such as the interconnection reactor, may be omitted. As a result, it is possible to reduce the number of components.

The power conversion system 1 in which the plurality of power conversion devices 4 are connected in parallel as in the case of the embodiment has an advantage that the power conversion system 1 can handle large electric power while individual power conversion devices 4 is allowed to have a small capacity or a medium capacity. Even if there is an increase in the number of power conversion devices 4, each of which has a small capacity or a medium capacity, and which are connected in parallel, there may be a case where cost advantage and the like can be obtained compared with the case where one or a small number of power conversion devices 4 having a large capacity are disposed.

In FIG. 1, a fundamental wave current $I_1$, a ripple current $I_2$, and a resonant current $I_3$ are illustrated as electric currents which flow through the power conversion system 1. The fundamental wave current $I_1$ is a main electric current of AC to be outputted from the power conversion circuit 4a. The ripple current $I_2$ is a high frequency current which is generated with switching of the power conversion circuit 4a. In the case where the plurality of power conversion devices are connected in parallel, an electric current may be generated between one power conversion device and another power conversion device due to resonance of elements of the AC filter circuits. This electric current due to resonance is referred to as "resonant current $I_3$" for the sake of convenience.

Figure 2:
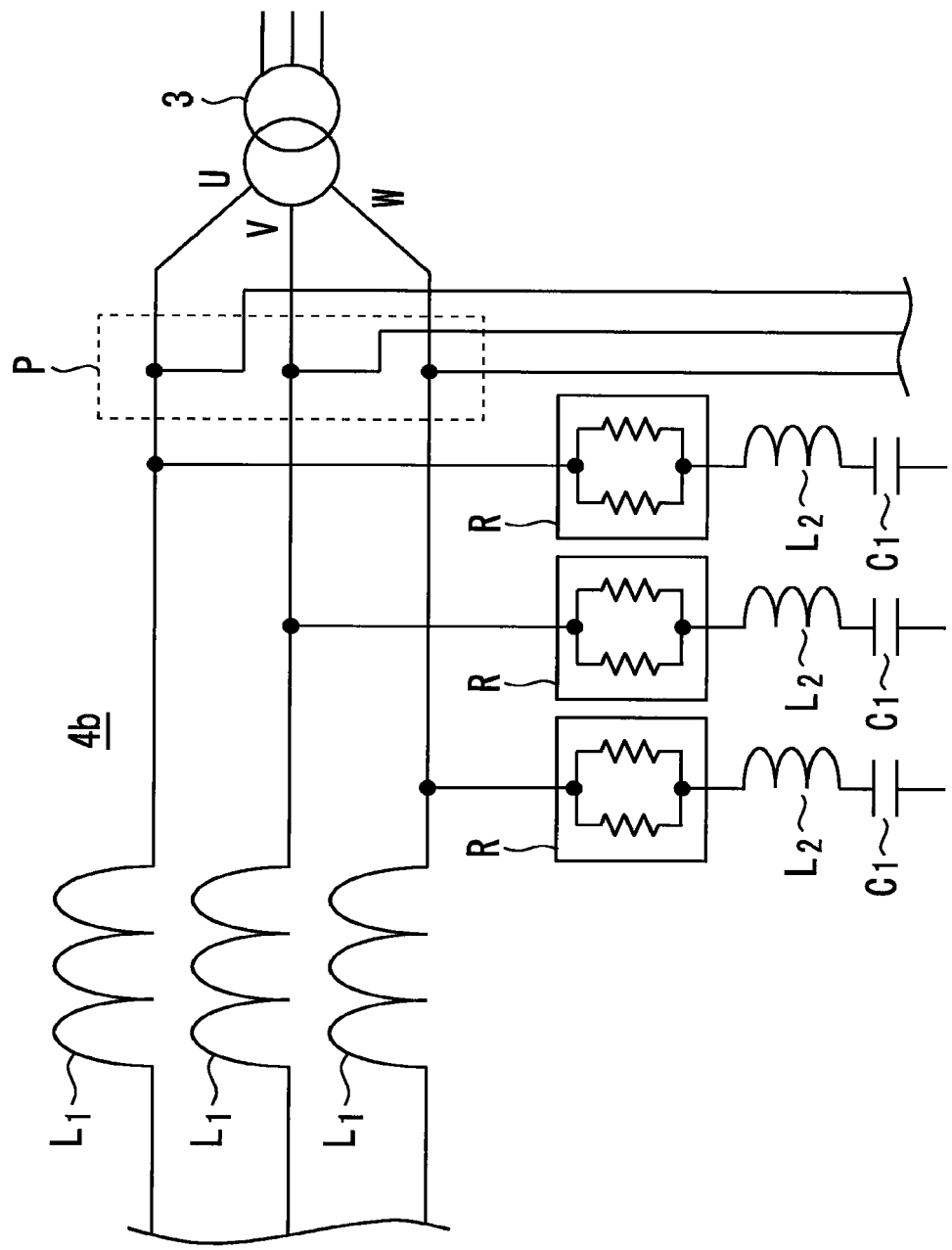
FIG. 2 is a diagram for describing AC filter circuits of the power conversion system according to the embodiment.

FIG. 2 is a diagram for describing the AC filter circuit 4b of the power conversion system 1 according to the embodiment. FIG. 2 is a diagram for describing the configuration of the AC filter circuit 4b in a three-phase AC system. In the embodiment, the power conversion circuit 4a forms a three-phase inverter circuit so that each of UVW three-phase connections is provided with the AC filter circuit 4b. However, in the case where the power conversion circuit 4a forms a single-phase or two-phase inverter circuit or the like as a modification, the three-phase connections shown in FIG. 2 are reduced to one-phase connection or two-phase connection. In this case, the AC filter circuit 4b corresponding to the number of reduced connections may be omitted.

According to the above-mentioned power conversion system 1, each second filter reactor $L_2$ is connected in series to the AC filter capacitor $C_1$ of the L-type LC low-pass filter. The fundamental wave current $I_1$ does not flow into the second filter reactor $L_2$ so that even a reactor having a small size can satisfy required performance. Therefore, it is possible to achieve a reduction in size of the inductance component and the capacitance component which construct the AC filter circuit 4b while required performance of filtering the ripple current $I_2$ is sufficiently ensured. Whereas the resistance R provided to the AC filter circuit 4b acts as a damping element and hence, even when an L-type LC low-pass filter is used, the resonant current $I_3$ between the plurality of power conversion devices 4 can be suppressed. Accordingly, it is possible to achieve both a reduction in size of the AC filter circuit 4b and suppression of the resonant current $I_3$. Using a circuit component having a small size also reduces costs.

Figure 3:
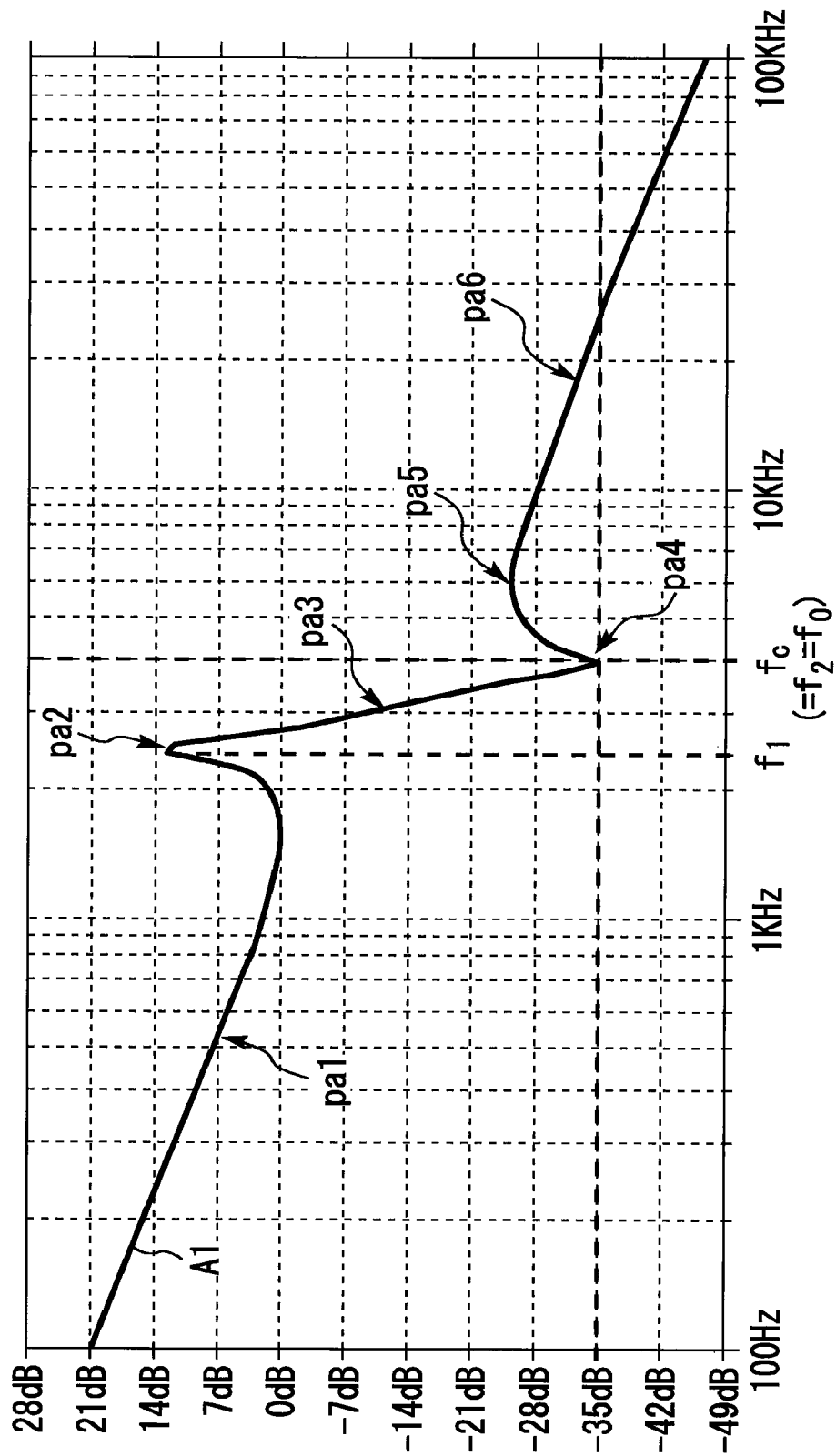
FIG. 3 is a graph for describing a frequency characteristic of the AC filter circuit of the power conversion system according to the embodiment.

FIG. 3 is a graph for describing a frequency characteristic of the AC filter circuit 4b of the power conversion system 1 according to the embodiment. In the graph of the frequency characteristic shown in FIG. 3, a gain characteristic A1 of the AC filter circuit 4b is illustrated. The gain characteristic A1 includes a low-frequency portion pa1, a local maximum pa2, an intermediate portion pa3, a local minimum pa4, an inflection point pa5, and a high-frequency portion pa6.

The low-frequency portion pa1 is a portion which is provided on a low frequency side, and in which the gain gradually decreases corresponding to an increase in frequency. The local maximum pa2 is a portion which is present on the high frequency side of the low-frequency portion pa1, and which is sharpened upward in the graph. The intermediate portion pa3 is a portion which is present on the high frequency side of the local maximum pa2, and in which the gain rapidly falls corresponding to an increase in frequency. The local minimum pa4 is the lower end of the intermediate portion pa3. The inflection point pa5 is a point where a change rate of the gain characteristic changes from a positive to a negative after a rapid rise from the local minimum pa4. The high-frequency portion pa6 is a portion which is present on the high frequency side of the inflection point pa5, and in which the gain gradually decreases corresponding to an increase in frequency.

FIG. 3 describes a first frequency f1, which corresponds to the local maximum pa2, and a second frequency f2, which corresponds to the local minimum pa4. The second frequency f2 is determined by a resonance frequency fo of an LC series circuit which is formed of the second filter reactor $L_2$ and the AC filter capacitor $C_1$. The resonance frequency fo is determined based on the inductance value of the second filter reactor $L_2$ and the capacitance value of the AC filter capacitor $C_1$.

It is preferable that the resonance frequency fo be equal to a carrier frequency fc in the power conversion circuit 4a. The carrier frequency fc is a frequency which is determined corresponding to switching control parameters of the power conversion circuit 4a. When the resonance frequency fo and the carrier frequency fc are made equal to each other, in the L-type LC low-pass filter which uses components having a low inductance and a low capacitance, it is possible to ensure the gain equivalent to that of a T-type LC low-pass AC filter circuit.

Figure 4:
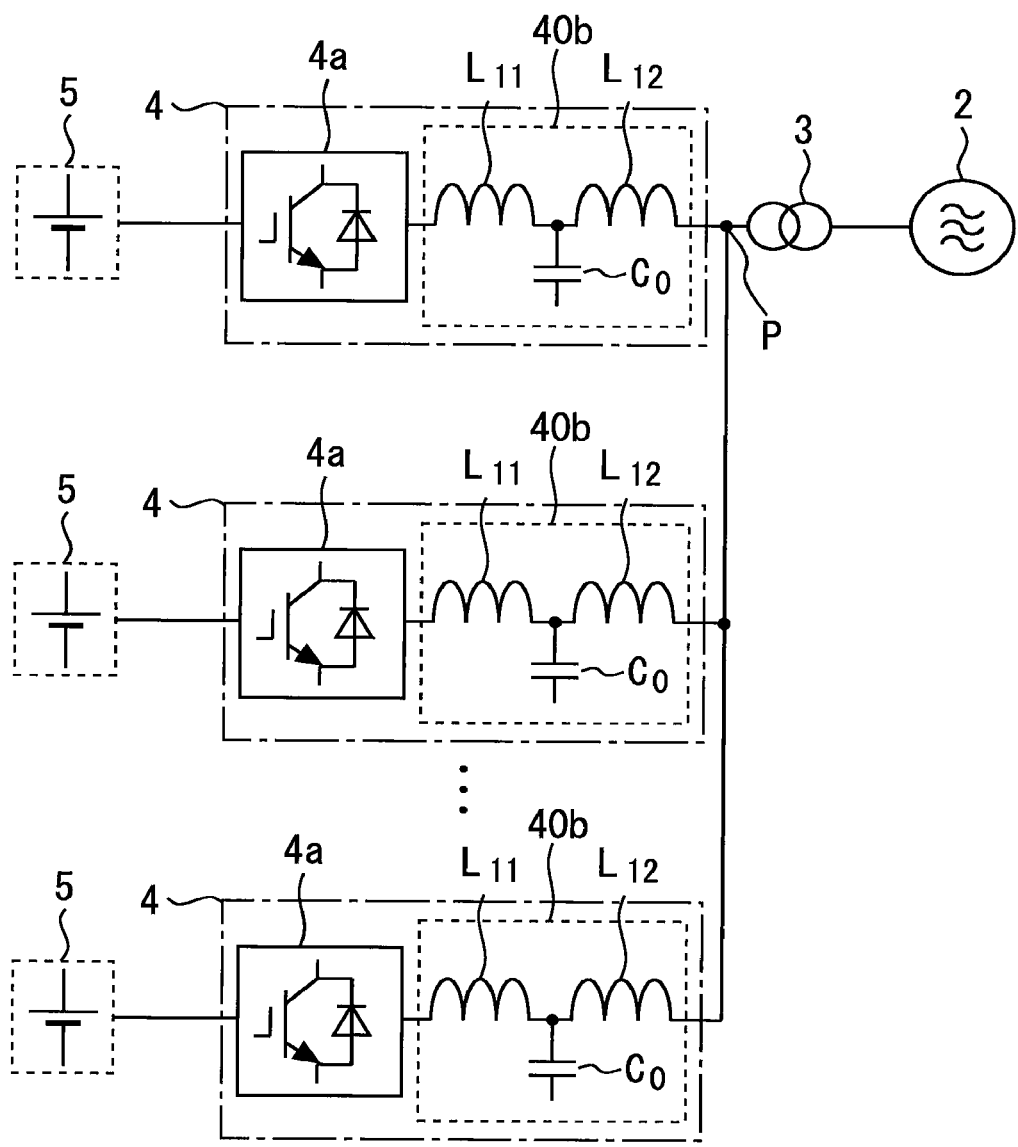
FIG. 4 is a system configuration diagram of a power conversion system according to a comparison example.
Figure 5:
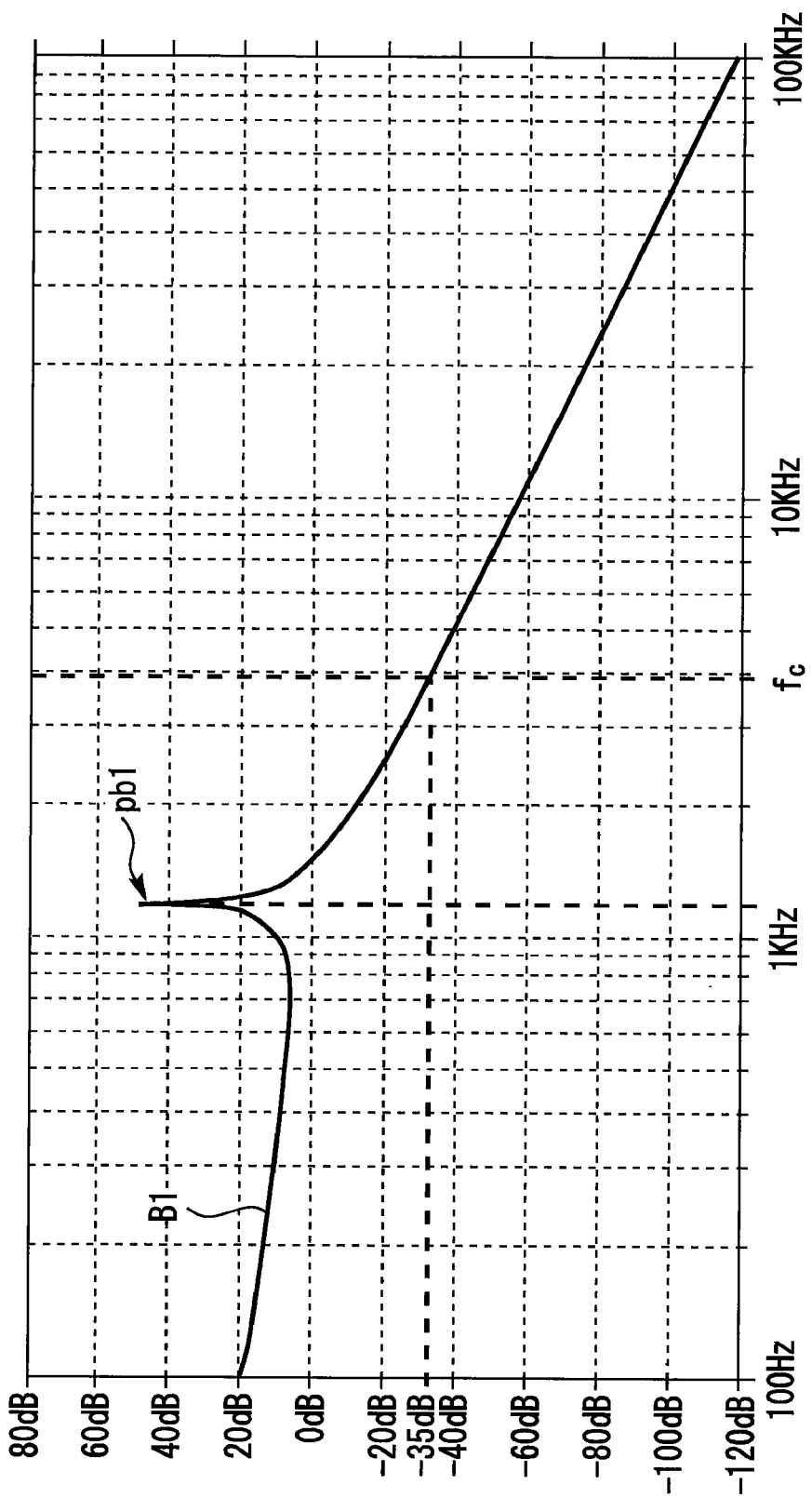
FIG. 5 is a graph for describing a frequency characteristic of an AC filter circuit according to the comparison example.
Figure 6:
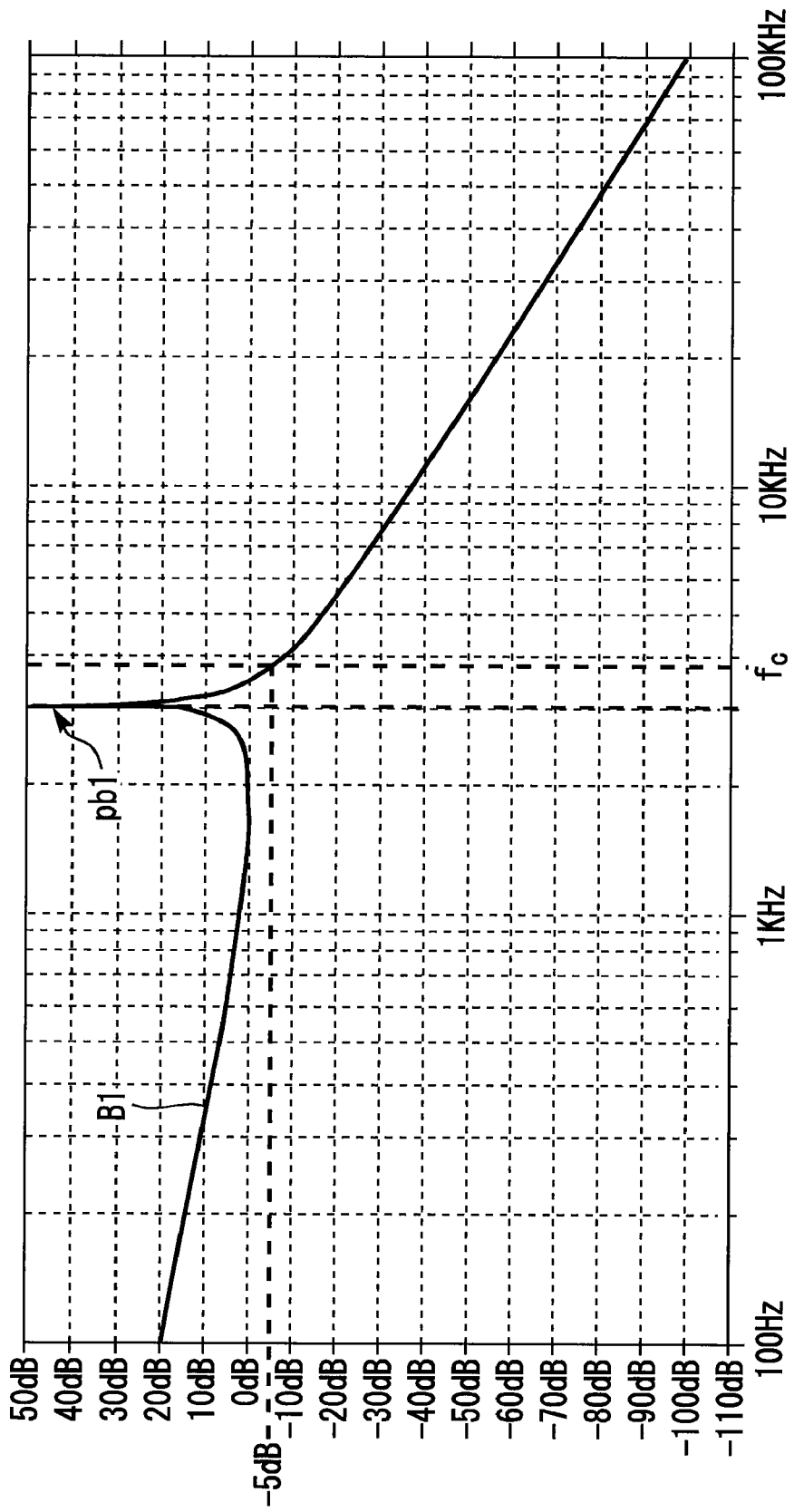
FIG. 6 is a graph for describing a frequency characteristic of an AC filter circuit according to a comparison example.

Advantageous effects of the embodiment will be described with reference to comparison examples shown in FIG. 4 to FIG. 6. FIG. 4 is a system configuration diagram of a power conversion system 1 according to the comparison example. FIG. 5 and FIG. 6 are graphs for describing a frequency characteristic of an AC filter circuit 40b according to the comparison example. FIG. 5 and FIG. 6 show a gain characteristic B1 of the AC filter circuit 40b, and also show a local maximum pill of the gain characteristic B1.

In the comparison example shown in FIG. 4, the AC filter circuit 40b is a T-type LC low-pass filter. In other words, the T-type LC low-pass filter is an LCL low-pass filter where a reactor and a capacitor are connected in the order of LCL.

The AC filter circuit 40b according to the comparison example has the following defects. The fundamental wave current $I_1$ of the power conversion circuit 4a and the ripple current I2 which is generated with switching of the power conversion circuit 4a pass through a first filter reactor $L_{11}$. Therefore, the first filter reactor $L_{11}$ has a large volume.

Only the fundamental wave current $I_1$ of the power conversion circuit 4a passes through a second filter reactor $L_{12}$. The volume of the iron core of the second filter reactor $L_{12}$ is smaller than the volume of the iron core of the first filter reactor $L_{11}$. However, the winding wire of the second filter reactor $L_{12}$ is required to have a cross-sectional area which corresponds to that of the winding wire of the first filter reactor $L_{11}$.

An AC filter capacitor $C_0$ absorbs the ripple current $I_2$ which is generated with switching of the power conversion circuit 4a. Therefore, the AC filter capacitor $C_0$ is required to have a capacitance value which is several % of the capacity of the power conversion device 4. Further, from the viewpoint of a control, it is necessary to compensate the capacity of the AC filter capacitor at the AC output end of the power conversion circuit 4a so that there is also a defect that excess reactive power is outputted.

In contrast, in the AC filter circuit 4b according to the embodiment, the second filter reactor $L_2$ and the AC filter capacitor $C_1$ are selected such that the resonance frequency fo assumes a value which corresponds to the carrier frequency fc of the power conversion circuit 4a.

When a comparison is made between the graph of the embodiment shown in FIG. 3 and the graph of the comparison example shown in FIG. 5, gains have the same value (that is −35 dB) at the same carrier frequency fc, so that substantially the same filter performance can be acquired. To realize the frequency characteristic of the graph of the comparison example shown in FIG. 5, it is necessary to set the inductance value and the capacitance value of components which constitute the AC filter circuit 40b larger than the inductance value and the capacitance value of components which constitute an AC filter circuit 4b of the embodiment.

Specifically, the inductance value of the first filter reactor L11 of the comparison example which realizes the characteristic shown in FIG. 5 is larger than the first filter reactor L1 of the embodiment by approximately 1.33 times. Further, the capacitance value of the AC filter capacitor C0 of the comparison example which realizes the characteristic shown in FIG. 5 is larger than the AC filter capacitor C1 of the embodiment by approximately 6 times. As a result, the AC filter circuit 40b according to the comparison example has a problem that a size of the constitutional components becomes larger than that of the AC filter circuit 4b according to the embodiment.

On the other hand, according to the embodiment, even if the inductance value and the capacitance value in the AC filter circuit 4b are set to values smaller than those of the comparison example, it is possible to acquire substantially the same filter performance (that is, −35 dB). In other words, according to the embodiment, the inductance value of the first filter reactor $L_1$ can be reduced to approximately 1/1.33 of the inductance value of the first filter reactor $L_{11}$.

In the embodiment, there is no second filter reactor $L_{12}$ of the comparison example so that the second filter reactor $L_2$ is required as a resonance reactor. However, an electric current which passes through the second filter reactor $L_2$ is the ripple current $I_2$ only. The ripple current $I_2$ is sufficiently smaller than the fundamental wave current $I_1$ so that it is possible to have an advantage that the second filter reactor $L_2$ has a small volume.

Further, according to the embodiment, the capacitance value of the AC filter capacitor $C_1$ can also be reduced to approximately ⅙ of the AC filter capacitor $C_0$. Therefore, it is possible to use a small-sized capacitor as the AC filter capacitor $C_1$. With the use of the small-sized circuit components as described above, it is possible to expect a cost reduction effect brought about by a reduction in the volume of the components, and it is also possible to expect a cost reduction effect brought about by a reduction in the number of circuit components.

As described above, according to the configuration of the AC filter circuit 4b obtained by adding the second filter reactor $L_2$ to an L-type LC low-pass filter, substantially the same filter performance can be created using components having the lower inductance and the lower capacitance than those of the AC filter circuit 40b of the comparison example, which is a T-type LC low-pass filter.

However, the AC filter circuit 4b according to the embodiment does not include the second filter reactor $L_{12}$ which is provided on the downstream side of the first filter reactor $L_{11}$, and which is included in the T-type LC low-pass filter of the comparison example. As a result, unlike the AC filter circuit 40b of the comparison example, the second filter reactor $L_{12}$ provided on the downstream side of the first filter reactor $L_{11}$ cannot be caused to act as a damping element. However, in the embodiment, the resistance R which is added to the AC filter circuit 4b acts as the damping element and hence, it is possible to suppress the resonant current $I_3$ which flows on the output side of the plurality of power conversion devices 4.

The resistance R which acts as the damping element is provided for reducing the resonant current $I_3$ which flows between power conversion devices 4 arranged in parallel so that the resistance component having a large size may not be used. Therefore, it is possible to achieve both a reduction in size of the AC filter circuit 4b and suppression of the resonant current $I_3$. Further, for a control, the capacity of the AC filter capacitor $C_1$ can be reduced and hence, there is an advantage that compensating reactive power can also be reduced.

FIG. 6 is a second frequency characteristic graph relating to the comparison example. FIG. 6 shows a frequency characteristic in the case where the first filter reactor $L_{11}$ is caused to have the same inductance value as the first filter reactor $L_1$, and the AC filter capacitor $C_0$ is caused to have the same capacitance value as the AC filter capacitor $C_1$. When a comparison is made between the graph of the comparison example shown in FIG. 6 and the graph of the embodiment shown in FIG. 3, in the graph of the comparison example shown in FIG. 6, the gain at the carrier frequency fc is near −5 dB, so filter performance is deteriorated compared with the graph of the embodiment shown in FIG. 3.

The modification of the embodiment will be described. A modification may be provided where the carrier frequency fc and the resonance frequency fo do not completely match. As described with reference to FIG. 3 and FIG. 5, according to the embodiment, the inductance value of the first filter reactor $L_1$ can be reduced to 1/1.33 of the inductance value in the comparison example, and the capacitance value of the AC filter capacitor $C_1$ can be reduced to ⅙ of the capacitance value in the comparison example. Within a range where an effect of reducing at least one of the inductance value or the capacitance value can be obtained, there may be a difference between the carrier frequency fc and the resonance frequency fo. It is sufficient that the resonance frequency fo is positioned somewhere near the carrier frequency fc.

By adjusting the inductance value of the second filter reactor $L_2$ and the capacitance value of the AC filter capacitor $C_1$, it is possible to adjust a difference between the carrier frequency fc and the resonance frequency fo on the axis of frequency.

Various modifications of the resistance R may also be conceivable. For the resistance R, any of known various resistance components may be used. The resistance R may be a large current resistance which allows a flow of a large current. However, it is not preferable to provide a larger resistance than necessary. For example, in the case where the magnitude of the ripple current $I_2$ is 1/10 or less of the magnitude of the fundamental wave current $I_1$, it is sufficient for the resistance R to have the current resistance specification of a degree that the resistance R can withstand a flow of an electric current of 1/10 or less of the fundamental wave current $I_1$. It is preferable that the resistance R be constructed to suppress heat to be generated when the ripple current $I_2$ flows. For example, the resistance R may be constructed to have a structure where the amount of heat generation with respect to an electric current is suppressed. The resistance R may be a resistance component to which a heat radiation unit or a cooling unit is provided.

As exemplified in FIG. 2, the resistance R may be constructed by connecting a plurality of resistance components in parallel. As a modification, the resistance R may be constructed by only one resistance component. Alternatively, the resistance R may be constructed by connecting a plurality of resistance components in series or in series-parallel.

The resistance R may be a non-inductive resistor. The non-inductive resistor is a resistor where parasitic inductance is significantly suppressed. The non-inductive resistor is formed by a winding method referred to as "non-induction winding". The "non-induction winding" is a structure where two resistance wires are wound in opposite winding directions. Provided that the two resistance wires have the same number of turns, and the same amount of electric current flowing therethrough, magnetic fields to be generated in the two resistance wires have the same magnitude but opposite directions. As a result, the magnetic fields cancel each other out so that the inductance can be reduced.

As one example of the non-inductive resistor, a known resistance disclosed in JP 2010-109256 A or the like, for example, may also be used. The non-inductive resistor is constituted not to release inductive components during energization (not to have inductance). Non-inductive resistors of this kind include a non-inductive resistor of a wire wound type and a non-inductive resistor of a solid type. The non-inductive resistor of the wire wound type may be constructed to be energized such that "a winding direction of one winding wire" and "a winding direction of an adjacent winding wire" are made opposite to each other so that a magnetic field (magnetic flux) generated by the above-mentioned one winding wire and a magnetic field (magnetic flux) generated by the adjacent winding wire cancel each other out. The non-inductive resistor of the wire wound type may also be constructed to be energized such that "a winding direction of a winding wire in one zone" and "a winding direction of a winding wire in an adjacent zone" are made opposite to each other so that a magnetic field (magnetic flux) generated by the winding wire in the one zone and a magnetic field (magnetic flux) generated by the winding wire in the adjacent zone cancel each other out. With such a winding method, inductive components can be reduced so that actual inductance can be reduced to an extremely small value. Further, the non-inductive resistor of the solid type is constructed such that a solid per se, such as a carbon film or a metal film, forming a resistor has a cylindrical shape or a wide thin shape. With such a configuration, the inductive components can be reduced.

As another example of the non-inductive resistor, a known resistance disclosed in JP 2001-143915 A or the like may also be used. The non-inductive resistor may be a non-inductive resistor obtained by folding back and winding a resistance wire, or a non-inductive resistor obtained by forming a resistance film on a planar insulator in a zigzag manner. Whereas a wire wound resistor, a carbon film resistor, a metal film resistor, a solid resistor, a chip resistor, and other resistors are put into practice as solid resistors. A resistor having sufficiently smaller inductance than a general resistor is referred to as "non-inductive resistor" and is used as a non-inductive resistor. Therefore, a solid resistor and a chip resistor which do not generally form a coil-shaped electric path may be treated as the non-inductive resistor.

As still another example of the non-inductive resistor, a known resistance disclosed in JP H6-32642 U or the like may also be used. As a non-inductive resistor having a round rod shape, a metal resistance, a ceramic resistance or the like may also be used. Further, as a non-inductive resistor having a flat shape, a metal thin-film resistance, an Ayrton-Perry winding resistance or the like may also be used.

The resistance R may be a plate-shaped resistor. For the plate-shaped resistor, a known plate-shaped resistor disclosed in JP 2010-287842 A or the like may also be used. A high-power non-inductive resistor may also be used where a resistor includes a plate-shaped resistance portion having electrode portions at both ends thereof, an insulating plate which insulates this resistor, and a heat radiation plate are stacked. The insulating plate may be a pair of ceramic substrates which are respectively stacked on both surfaces of the resistance portion of the resistor.

The resistor is not limited to the above, and any of various large current resistors may also be used as the resistance R.

For example, a known resistance disclosed in JP 2017-162948 A or the like may also be used. In a high voltage and large current field, such as a power supply circuit and a power conversion circuit, a cement resistor or a vitreous enamel resistor may also be used. The cement resistor may be a resistor formed such that a wire wound resistance unit or a metal oxide film resistance unit is put into a casing made of ceramic, and the casing is sealed by a silicon based resin (cement). The vitreous enamel resistor may be a resistor formed such that a resistance wire is wound around a bobbin made of porcelain, and is coated by vitreous enamel.

For example, a known resistance disclosed in JP 2002-175901 A or the like may also be used. In a power converter, such as an inverter or a power module on which an IGBT element and the like are mounted, an electric resistor with high accuracy of approximately 0.1 mΩ to 100 mΩ is used to accurately detect a large current ranging from approximately several A to 400 A. The power converter allows a large current so that large electric power is generated in a resistor whereby it is necessary to radiate heat. For a unit to radiate heat, a resistor may also be used which has a structure where a plurality of resistance alloy sheets and a plurality of heat radiation metal sheets are stacked with resin insulating layers interposed therebetween. To accurately detect an electric current, a copper-manganese-based alloy, a copper-manganese-nickel-based alloy, or a copper-nickel-based alloy having a large resistance ratio may also be used as a resistance alloy. An example of such a copper-manganese-nickel-based alloy may be Manganin. Further, a copper-nickel-based alloy may be an alloy which contains a small amount of Mn, Fe, and Si in addition to constantan and the like.

The resistance value of the resistance R may be 10 mΩ or less, for example. For example, the resistance value of the resistance R may be 1 mΩ to 20 mΩ, may be 1 mΩ to 15 mΩ, or may be 1 mΩ to 10 mΩ. Alternatively, the resistance value of the resistance R may be 5 mΩ to 20 mΩ, may be 10 mΩ to 20 mΩ, or may be 15 mΩ to 20 mΩ. Alternatively, the resistance value of the resistance R may be 5 mΩ to 15 mΩ, or 5 mΩ to 10 mΩ.

REFERENCE SIGNS LIST 1 power conversion system
2 power system
3 upper transformer
4 power conversion device
4$a$ power conversion circuit
4$b$ AC filter circuit
5 distributed power supply
40$b$ AC filter circuit
A1 gain characteristic
$C_0$, $C_1$ AC filter capacitor
fc carrier frequency
fo resonance frequency
$I_1$ fundamental wave current
$I_2$ ripple current
$I_3$ resonant current
$L_1$, $L_{11}$ first filter reactor
$L_{12}$, $L_2$ second filter reactor
P parallel junction
R resistance (damping resistance)

The invention claimed is:

1. A power conversion system comprising:
a plurality of power conversion devices connected in parallel, each of the plurality of power conversion devices including:
a power conversion circuit configured to convert DC to AC; and
an AC filter circuit connected to an output side of the power conversion circuit,
the AC filter circuit being an LC low-pass filter formed of a first filter reactor and a series circuit, a first end of the first filter reactor being connected to the output side of the power conversion circuit, a second end of the first filter reactor being connected to a power system, the series circuit being formed of an AC filter capacitor, a second filter reactor, and a resistance which are connected in series, the LC low-pass filter being constructed by connecting one end of the series circuit to the second end of the first filter reactor,
wherein the resistance is a high-power non-inductive resistor, in which a resistor with a plate-shaped portion having electrode portions at both ends thereof, an insulating plate which insulates the resistor and a heat radiation plate are stacked.

2. The power conversion system according to claim 1, wherein a resonance frequency of an LC series circuit which is formed of the second filter reactor and the AC filter capacitor is equal to a carrier frequency of the power conversion circuit.

3. The power conversion system according to claim 1, wherein the AC filter circuit has a gain characteristic including a low-frequency portion, a high-frequency portion, and an intermediate portion between the low-frequency portion and the high-frequency portion, and the gain characteristic has a local maximum between the low-frequency portion and the intermediate portion, and has a local minimum between the intermediate portion and the high-frequency portion.

* * * * *